United States Patent
Lu et al.

(10) Patent No.: US 7,952,318 B2
(45) Date of Patent: May 31, 2011

(54) SYSTEM AND METHOD FOR DETERMINING STATOR WINDING RESISTANCE IN AN AC MOTOR

(75) Inventors: Bin Lu, Kenosha, WI (US); Thomas G. Habetler, Snellville, GA (US); Pinjia Zhang, Atlanta, GA (US); Peter J. Theisen, West Bend, WI (US)

(73) Assignee: Eaton Corporation, Cleveland, OH (US)

( * ) Notice: Subject to any disclaimer, the term of this patent is extended or adjusted under 35 U.S.C. 154(b) by 443 days.

(21) Appl. No.: 12/132,484

(22) Filed: Jun. 3, 2008

(65) Prior Publication Data

US 2009/0051311 A1    Feb. 26, 2009

Related U.S. Application Data

(60) Provisional application No. 60/932,743, filed on Jun. 4, 2007, provisional application No. 60/932,817, filed on Jun. 4, 2007.

(51) Int. Cl.
*H02P 23/14* (2006.01)
*H02K 11/00* (2006.01)

(52) U.S. Cl. ......... 318/806; 318/490; 318/606; 318/608

(58) Field of Classification Search .................. 318/504, 318/727, 778, 802, 807, 490, 608, 606, 806; 324/772; 702/41
See application file for complete search history.

(56) References Cited

U.S. PATENT DOCUMENTS

| | | | |
|---|---|---|---|
| 4,083,001 A | | 4/1978 | Paice |
| 4,829,234 A | | 5/1989 | Gretsch |
| 5,502,360 A | * | 3/1996 | Kerkman et al. ............ 318/805 |
| 5,510,687 A | * | 4/1996 | Ursworth et al. ............ 318/727 |
| 5,565,752 A | * | 10/1996 | Jansen et al. ................ 318/807 |
| 5,585,709 A | * | 12/1996 | Jansen et al. ................ 318/807 |
| 5,608,302 A | * | 3/1997 | Umida ......................... 318/802 |
| 5,637,976 A | * | 6/1997 | Chen et al. .................. 318/809 |
| 6,005,364 A | * | 12/1999 | Acarnley ..................... 318/632 |
| 6,042,265 A | | 3/2000 | Kliman et al. |

(Continued)

FOREIGN PATENT DOCUMENTS

EP    1168590 A1 *  1/2002

(Continued)

OTHER PUBLICATIONS

Paice, "Motor Thermal Protection by Continuous Monitoring of Winding Resistance," IEEE Transactions On Industrial Electronics And Control Instrumentation, vol. IECI-27, No. 3, Aug. 1980, pp. 137-141.

(Continued)

*Primary Examiner* — Paul Ip
(74) *Attorney, Agent, or Firm* — Ziolkowski Patent Solutions Group, SC (57) ABSTRACT

A system and method for determining stator winding resistance in an AC motor is disclosed. The system includes a circuit having an input connectable to an AC source and an output connectable to an input terminal of an AC motor. The circuit includes at least one contactor and at least one switch to control current flow and terminal voltages in the AC motor. The system also includes a controller connected to the circuit and configured to modify a switching time of the at least one switch to create a DC component in an output of the system corresponding to an input to the AC motor and determine a stator winding resistance of the AC motor based on the injected DC component of the voltage and current.

20 Claims, 3 Drawing Sheets

U.S. PATENT DOCUMENTS

| | | | |
|---|---|---|---|
| 6,380,708 B1 | 4/2002 | Gritter et al. | |
| 6,586,905 B1* | 7/2003 | Johnson | 318/778 |
| 6,594,592 B1* | 7/2003 | Griepentrog et al. | 702/41 |
| 6,621,291 B2* | 9/2003 | Lee et al. | 324/772 |
| 6,636,012 B2* | 10/2003 | Royak et al. | 318/727 |
| 6,650,245 B2* | 11/2003 | Chung | 340/648 |
| 6,803,748 B2* | 10/2004 | Peter | 322/29 |
| 6,847,187 B2 | 1/2005 | Kumar | |
| 7,184,902 B2 | 2/2007 | El-Ibiary | |
| 7,570,074 B2* | 8/2009 | Gao et al. | 324/772 |
| 2002/0093774 A1* | 7/2002 | Chung | 361/2 |
| 2003/0034793 A1* | 2/2003 | Lee et al. | 324/772 |
| 2003/0062870 A1* | 4/2003 | Royak et al. | 318/727 |
| 2005/0046397 A1* | 3/2005 | Peter | 322/44 |
| 2006/0250154 A1* | 11/2006 | Gao et al. | 324/772 |
| 2009/0058341 A1* | 3/2009 | Lu et al. | 318/504 |

FOREIGN PATENT DOCUMENTS

JP     2005218275 A     8/2005

OTHER PUBLICATIONS

Lee et al., "An Online Stator Winding Resistance Estimation Technique for Temperature Monitoring of Line-Connected Induction Machines," IEEE Transactions On Industry Applications, vol. 39, Issue 3, May/Jun. 2003, pp. 685-694.

Lee et al., "A Remote and Sensorless Thermal Protection Scheme for Small Line-Connected AC Machines," IEEE Transactions on Industry Applications, vol. 39, No. 5, Sep./Oct. 2003, pp. 1323-1332.

\* cited by examiner

FIG. 4 ically too sensitive to motor parameter variations to provide useful results for temperature estimation. That is, the estimation error of model-based methods can be about 20%, which is too high for use in temperature estimation.

SYSTEM AND METHOD FOR DETERMINING STATOR WINDING RESISTANCE IN AN AC MOTOR

CROSS-REFERENCE TO RELATED APPLICATION

The present application claims the benefit of U.S. provisional application Ser. No. 60/932,743, filed Jun. 4, 2007, and which is incorporated herein by reference. The present application also claims the benefit of U.S. provisional application Ser. No. 60/932,817, filed Jun. 4, 2007, and which is incorporated herein by reference.

GOVERNMENT LICENSE RIGHTS

The present invention was made at least in part with Government support under Contract No. DE-FC36-04GO14000, awarded by the United States Department of Energy. The Government may have certain rights in the invention.

BACKGROUND OF THE INVENTION

The present invention relates generally to alternating current (AC) motors and, more particularly, to a system and method for determining stator winding resistance for thermal protection of AC motors.

Thermal protection is an important aspect in the monitoring of motor conditions, as motor failures can often be related to the stator winding insulation. It is commonly assumed that the motor's life is reduced by 50% for every 10° C. increase in temperature above an acceptable stator winding temperature limit. Therefore, accurate monitoring of the stator winding temperature is beneficial for motor protection purposes.

Various methods and mechanisms for determining the stator winding temperature are currently employed. Aside from the direct stator winding temperature measurement, thermal model-based and motor parameter-based temperature estimation methods are two major techniques for thermal protection. The thermal model-based methods estimate the stator winding temperature using motor thermal models. However, due to the thermal parameter variation and the difficulty of thermal parameter identification, the accuracy of these methods can fall outside acceptable ranges. Besides, due to the change of cooling conditions, the thermal parameters are not constant, and may need to be identified for each motor under each specific cooling condition.

The AC motor parameter-based approaches to determining stator winding temperature are developed to estimate the average winding temperatures from the stator winding resistances. Stator winding resistance ($R_s$) estimation is broadly used not only in thermal protection, but also in motor controls, fault diagnosis, and efficiency evaluation. Over the years, various $R_s$ estimation methods have been proposed for different purposes. Generally, they are divided into three major categories: direct measurement methods, equivalent circuit-based methods, and signal-injection-based methods. Direct methods, such as the IEEE standard-118, give the most accurate $R_s$ estimates, but have limitations and drawbacks due to the fact that resistance is only measured at a certain temperature and the resistance variations due to temperature changes are not considered. A further drawback of direct measurement methods is that the motor has to be disconnected from service to perform the required tests.

The equivalent circuit-based methods of $R_s$ estimation use the motor current and voltage to calculate the stator resistance based on an AC motor equivalent circuit (i.e., a model of the AC motor). Such model-based methods are non-intrusive and can respond to changes in the cooling conditions but are generally too sensitive to motor parameter variations to provide useful results for temperature estimation. That is, the estimation error of model-based methods can be about 20%, which is too high for use in temperature estimation.

The signal injection-based methods for determining stator resistance inject a DC bias into the stator supply voltage and use the DC component of the voltage and current to calculate the stator resistance. In one DC injection method, a resistor in parallel with a transistor is installed in one phase of the motor, which leads to an equivalent resistance in the induction motor that is different when input current is positive and negative, thus producing a DC component. Although this approach can be accurate and robust to the variations in cooling conditions and motor parameters, it suffers from its intrusive nature, as an extra DC injection circuit needs to be installed in series with one of the motor leads. Additionally, due to the current limits of semiconductor devices, previous signal injection-based methods cannot generally be directly applied to motors beyond 100 hp.

It would therefore be desirable to design an accurate, non-intrusive method for determining stator winding resistance, without adding further resistance to the induction motor.

BRIEF DESCRIPTION OF THE INVENTION

The present invention provides a system and method for remote and sensorless stator winding resistance estimation for thermal protection of induction motors. The switching time of a switch in a motor control device is modified to generate a DC component in an output of the motor control device. This DC component is analyzed to determine a stator winding resistance, and a temperature of the stator windings is determined based on the stator winding resistance.

In accordance with one aspect of the invention, a motor control device to determine resistance of a stator winding of an AC motor includes a circuit having an input connectable to an AC source and an output connectable to an input terminal of an AC motor. The circuit further includes at least one contactor and at least one switch to control current flow and terminal voltages in the AC motor. The motor control device also includes a controller connected to the circuit and configured to modify switching time of the at least one switch to create a DC component in an output of the motor control device corresponding to an input to the AC motor and determine a stator winding resistance of the AC motor based on the injected DC component of the voltage and current.

In accordance with another aspect of the invention, a method for determining resistance of a stator winding of an AC motor without added sensors includes the step of providing a soft-starter in series between an AC power source and the AC motor, the soft-starter comprising at least one contactor and at least one solid-state switch to condition voltage and current to the AC motor. The method also includes the step of selectively operating the soft-starter in a bypass mode and a DC injection mode, wherein the bypass mode bypasses the DC injection mode for normal operation and wherein operating the soft-starter in the DC injection mode comprises opening a contactor for one phase and transmitting a gate drive signal having a delay angle therein to the at least one solid-state switch for the one phase, thereby introducing a DC bias into a phase of the AC motor Operating the soft-starter in the DC injection mode also includes measuring the DC bias in the voltage and current provided to the AC motor and determining the resistance of the stator winding based on the measured DC bias.

In accordance with yet another aspect of the invention, a soft-starter to control transmission of voltage and current from an AC power source to an induction motor having a stator winding includes a plurality of supply lines, with each supply line corresponding to a phase in the induction motor. The soft-starter also includes at least one solid-state switch on at least one of the plurality of supply lines to condition a motor line voltage and phase current to the induction motor and a processor programmed to delay gating of the at least one solid-state switch on one supply line to cause a DC component therein and determine the resistance of the stator winding based on the DC component.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENT

The embodiments of the invention set forth herein relate to a system and method for remote and sensorless stator winding resistance estimation for thermal protection of alternating current (AC) motors. The switching time of a switch in one phase in a motor control device is modified to generate a DC component that is measurable in each phase of the AC motor. This DC component is analyzed to determine a stator winding resistance, and a temperature of the stator windings is determined based on the stator winding resistance. While described below with respect to a three-phase, AC motor having windings connected in a wye-arrangement, it is also recognized that embodiments of the invention also include single-phase and other multi-phase motors having winding arrangements in various patterns (e.g., delta arrangement). The switching time of a switch in each of these various types of AC motors can be modified to inject a DC component into each phase of the motor.

Figure 1:
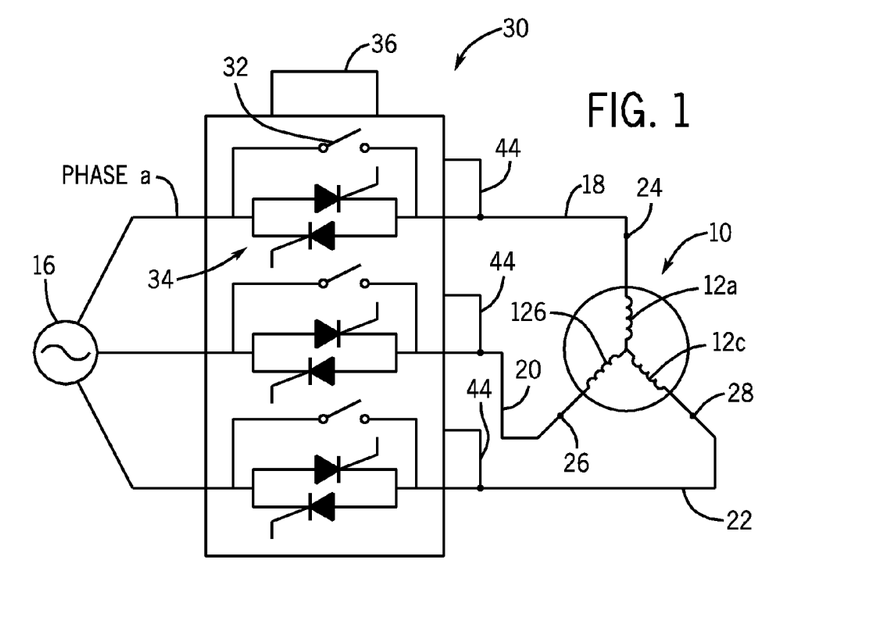
FIG. 1 is a schematic view of an AC motor system incorporating a motor control device for DC injection according to an embodiment of the invention.

Referring to FIG. 1, a three-phase, AC motor is shown according to an embodiment of the invention, and is generally designated by the reference numeral 10. As is conventional, AC motor 10 is represented as three windings 12a-12c connected in a wye-arrangement, although it can be appreciated that AC motor may be connected in a delta arrangement without deviating from the scope of the invention. Stator windings 12a-12c of AC motor 10 are operatively connected to an AC source 16 through corresponding supply lines 18, 20 and 22, respectively, at motor terminals 24, 26 and 28, respectively.

As shown in FIG. 1, a motor control device 30 is connected between AC source 16 and AC motor 10. In an exemplary embodiment of the invention, motor control device 30 comprises a soft-starter configured to limit the transient voltages and current to AC motor 10 during start-up, resulting in a "soft" motor start starting current that avoids inrush currents. The basic structure of soft-starter 30 is shown in FIG. 1 (i.e., circuitry of the soft-starter) as including a plurality of contactors 32 therein, with a contactor corresponding to each supply line 18, 20, 22 or each phase of the supply power. Soft-starter also includes multiple pairs of anti-parallel switches 34, such as solid-state switches in the form of thyristors, to control the current flow and, in turn, the terminal voltages of the motor. That is, a pair of thyristors 34 is connected in parallel for each supply line 18, 20, 22 or each phase of the supply power, with the thyristors 34 in each pair having an opposite polarity. While shown as including a pair of thyristors 34 on each supply line 18, 20, 22, it is also envisioned that soft-starter could have a pair of thyristors on only one or two supply lines (e.g., only supply line 18). Additionally, it is also recognized that, for a specified supply line, a thyristor could be arranged in parallel with a diode rather than another thyristor. In any of the embodiments described above, a thyristor 34 on a single supply line can be controlled to distort the input voltage and current received by AC motor 10, as described in detail below.

Also included in soft-starter 30 is a controller or processor 36 configured to control operation of thyristors 34 via the transmission of gate drive signals thereto, as well as control opening and closing of contactors 32. During start-up of AC motor 10, soft-starter 30 operates in a "start-up" mode, during which controller 36 causes one or more of contactors 32 corresponding to supply lines 18, 20, 22 to open such that power from AC source 16 passes through thyristors 34, thus controlling the current flow (and therefore the voltage) applied to the AC motor 10. Upon start-up of AC motor 10, the soft-starter enters a bypass mode in which controller 36 causes contactor 32 on each supply line 18, 20, 22 to close, so as to minimize power dissipation. The bypass mode thus is considered the "normal" mode of operation for the soft-starter 30 and for AC motor 10.

Figure 2:
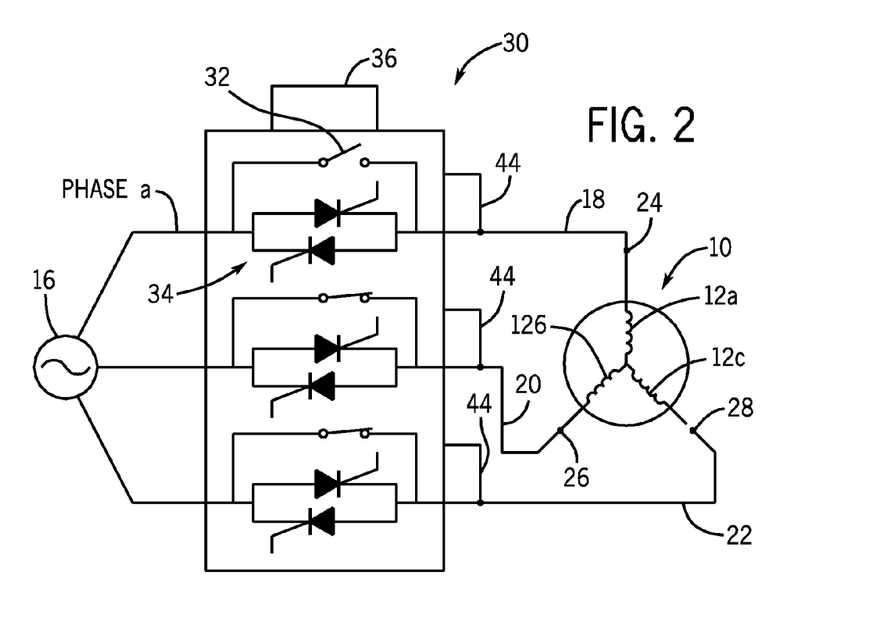
FIG. 2 is a schematic view of the AC motor system of FIG. 1 with the motor control device operating in a DC injection mode according to an embodiment of the invention.
Figure 3:
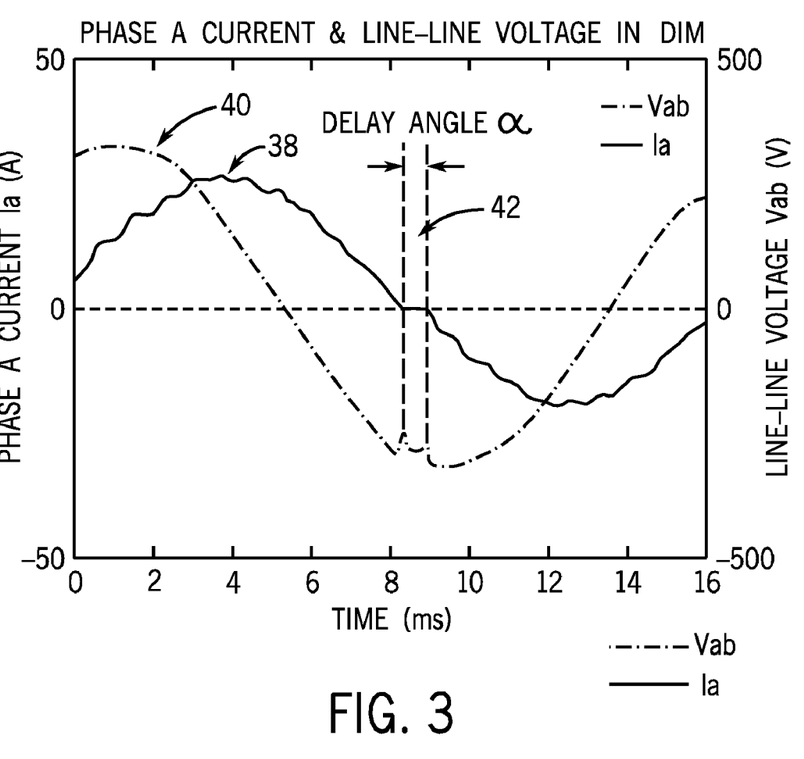
FIG. 3 is a diagram of a delay angle injected into the motor line voltages and phase currents of the AC motor according to an embodiment of the invention.

According to an embodiment of the invention, controller 36 is further programmed to operate soft-starter 30 in a gate drive control mode (i.e., a "DC injection mode") to inject a DC bias or components into the motor line voltages and phase currents, as shown in FIG. 2. During the DC injection mode, controller 36 operates to open a contactor 32 on one of the supply lines corresponding to only one phase (e.g., "phase a"), while the other two contactors 32 still work normally as in bypass mode and remain closed. Controller 36 also operates in an asymmetrical fashion to introduce a delay (i.e., a delay angle) to the gate drive signal sent to thyristors 34 corresponding to the open contactor of the phase a supply line 18, to modify a switching time thereof. In one embodiment, controller 36 operates to introduce a short delay to the gate drive signal of only one conducting thyristor 34 of phase a ($V_{G1}$ or $V_{G2}$) after the phase a current's rising or falling zero-crossing. The conducting thyristor 34 that receives the delay signal from controller can be either the forward conducting or backward conducting thyristor. In another embodiment, both the forward conducting and backward conducting thyristors 34 receive a delayed gate drive signal from controller 36, with the length of the delay (i.e., amplitude of the delay angle) of the signal differing for the forward conducting thyristor and the backward conducting thyristor. An example of the waveforms of the motor line voltage 38 ($v_{ab}$) and phase current ($i_a$) 40 when a delay angle 42 of α(e.g., α<30°) is added to the gate drive signal is shown in FIG. 3.

Referring again to FIG. 2, based on the introduction of the delay into the gate drive signal of the selected conducting thyristor(s) 34, a disturbance or distortion (i.e., a shift in the phase current and a notch in the line voltage) of at least one of the phases of the AC motor is caused, which generates or injects a DC component into the motor line voltages and phase currents. These DC components can be measured and determined for each DC injection mode period by voltage and current sensors 44 included in soft-starter 30. Because the DC components in the input voltages and currents do not "pass through" the air-gap of the AC motor (i.e., the rotor/stator air-gap), they have no impact on the rotor circuit of the AC motor 10. Therefore, an equivalent DC model of the AC motor with soft-starter 30 can be illustrated as in FIG. 4.

Figure 4:
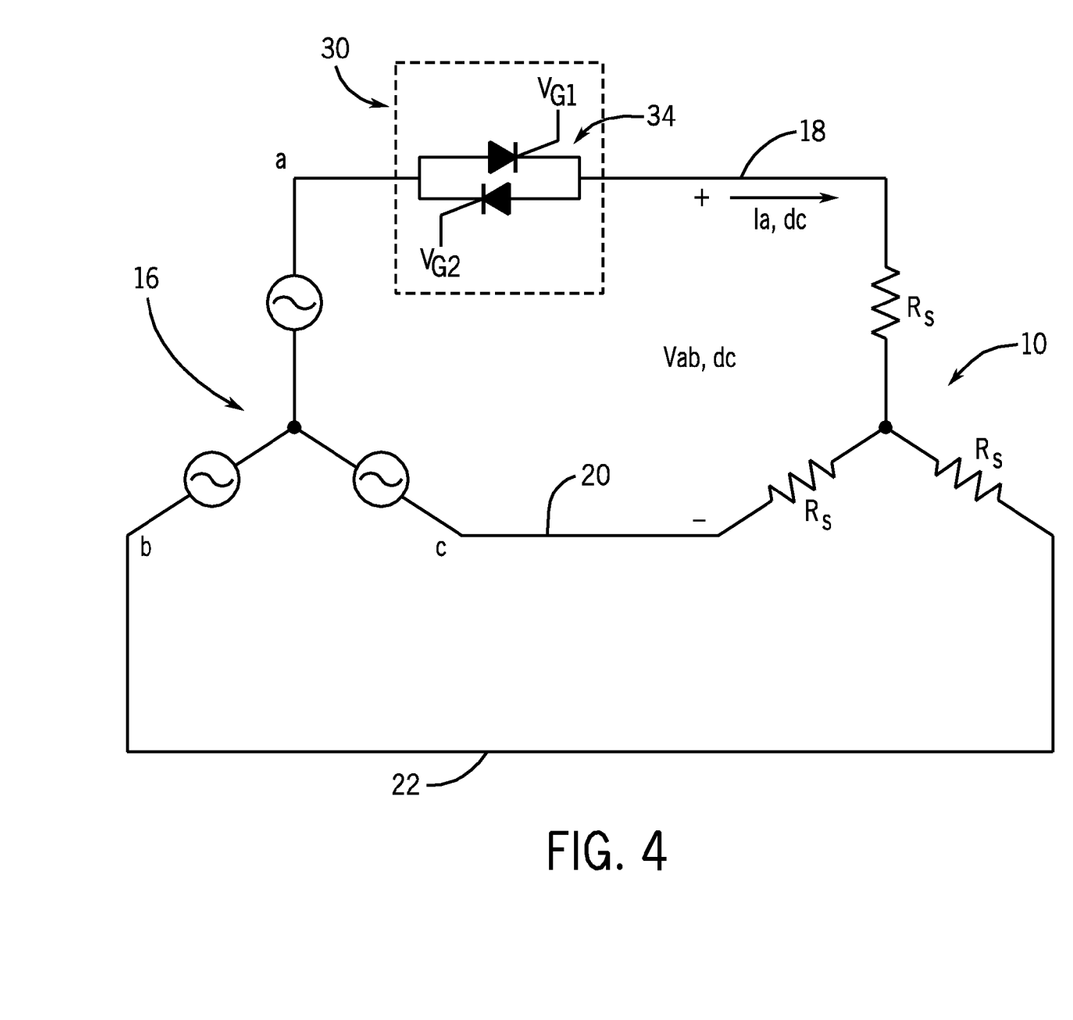
FIG. 4 is a schematic view of the DC equivalent circuit of the AC motor system of FIG. 2.

The stator resistance $R_s$ can be estimated from the terminal voltages and currents at the AC motor 10. The amplitude of the DC component from a line-to-line voltage and a phase current resulting from the disturbance/distortion therein caused by the delay of the gate drive signal, allowing for the estimation of the stator resistance $R_s$ as:

$$R_s = k \cdot \frac{v_{ab}^{dc}}{i_a^{dc}}, \quad [\text{Eqn. 1}]$$

where $v_{ab}^{dc}$ and $i_a^{dc}$ are the DC components of the motor line voltage $v_{ab}$ and phase current $i_a$, respectively, and k is a constant that is determined by the AC motor configuration. That is, for a three-phase AC motor having windings in a wye-arrangement, k=2/3. However, for a single phase or multi-phase motor, or for windings in an alternative arrangement, k would have a different value. Additionally, while Eqn. 1 shows that the phase current is measured for phase a, and that line-to-line voltage is measured between phases a and b, it is also envisioned that the phase current could be measured for a different phase and that the line-to-line voltage could be measured between phase a and a different phase. That is, the DC components of the motor line voltage and phase current are present in all phases of the AC motor. The current phases can thus be measured for the phase in which the delay signal was added (phase a) or another phase, and the line-to-line voltage can be measured between phase a and any other phase. For a single phase motor, it is noted that line-to-line voltage would be measured between the single phase line and a neutral line.

Based on the estimated $R_s$ from DC signal injection, the stator winding temperature $T_s$ can be monitored. The $R_s$ variation is linearly proportional to the $T_s$ variation, as:

$$\hat{T}_s = T_{s0} + \frac{(\hat{R}_s - R_{s0})}{\mu \cdot R_{s0}}, \quad [\text{Eqn. 2}]$$

where $T_{s0}$ and $R_{s0}$ represents $T_s$ and $R_s$ at room temperature; $\hat{T}_s$ and $\hat{R}_s$ are the estimated $T_s$ and $R_s$ from DC injection; and μ is the temperature coefficient of resistivity.

In determining the stator resistance $R_s$ from Eqn. 1 from the DC components $v_{ab}^{dc}$ and $i_a^{dc}$, the motor line voltage $v_{ab}$ and phase current $i_a$ are analyzed. For a small delay angle α (i.e., α<30°, see FIG. 3), it can be assumed that the motor line voltage $v_{ab}$ only includes the DC component and a supply fundamental frequency ($\omega_e$) component, as:

$$v_{ab} \approx v_{ab}^{dc} + v_{ab}^{\omega_e} \quad [\text{Eqn. 3}].$$

Similarly, the phase current $i_a$ can be approximately denoted as:

$$i_a \approx i_a^{dc} + i_a^{\omega_e} \quad [\text{Eqn. 4}],$$

where $i_a^{dc}$ and $i_a^{\omega_e}$ are the DC component and the line frequency component of $i_a$, respectively.

Therefore, the DC component in $i_a$ can be approximately derived as:

$$i_a^{dc} \approx -\hat{I}_a^{\omega_e} \sin(\alpha) \quad [\text{Eqn. 5}],$$

where $\hat{I}_a^{\omega_e}$ is the peak value of the line frequency component in $i_a$. The injected DC voltage $v_{ab}^{dc}$ can be approximately derived as:

$$v_{ab}^{dc} = \frac{3}{2} i_a^{dc} R_s \approx -\frac{3}{2} \hat{I}_a^{\omega_e} R_s \sin(\alpha). \quad [\text{Eqn. 6}]$$

Having determined the DC components of the voltage and current, $v_{ab}^{dc}$ and $i_a^{dc}$, the stator resistance $R_s$ can be estimated according to Eqn. 1 and, accordingly, the stator winding temperature $T_s$ can then be monitored based on the determined $R_s$ according to Eqn. 2 in real-time while the AC motor is in operation. In one embodiment of the invention, controller 36 (FIGS. 1 and 2) is configured to generate an alert (e.g., audible or visual alert) if the stator winding temperature exceeds a pre-determined threshold value. This alert allows an operator to take a desired action, such as shutting down the AC motor 10.

To obtain a more accurate $R_s$ estimate, it is desired that larger delay angles α be introduced to increase the percentage of DC components in the motor voltages and currents. However, it is recognized that injection of the DC component causes torque pulsations in the AC motor 10. Therefore, according to an embodiment of the invention, controller 36 (FIGS. 1 and 2) is programmed to inject maximal DC components into the voltage and current by introducing a maximal delay angle α in the thyristor gate drive signal, while keeping the resulting torque pulsations under a preset tolerance range.

To determine an acceptable delay angle α, the torque pulsations in the AC motor are analyzed. That is, the dominant components in the torque pulsations and their correlations to the injected DC components are analyzed using sequence analysis theory in a d-q reference frame. These torque pulsations are decomposed into components at multiples of the fundamental frequency, each of which can be separately monitored by observing the sequence components of the motor currents. Thus, the stator voltage, stator current, and total flux linkage are described as space vectors in the d-q stationary reference frame, and are defined as $\vec{v}_{dqs}$, $\vec{i}_{dqs}$, $\vec{\lambda}_{dqs}$ respectively.

Based on these variables, an air-gap torque, $T_{ag}$, can be calculated, with $T_{ag}$ being the cross product of $\vec{\lambda}_{dqs}$ and $\vec{i}_{dqs}$ according to:

$$T_{ag} = \frac{p}{2} |\vec{\lambda}_{dqs} \otimes \vec{i}_{dqs}|. \quad [\text{Eqn. 7}]$$

where p is the number of poles in the AC motor. In Eqn. 7, the flux linkage vector $\vec{\lambda}_{dqs}$ can be estimated based on the stator voltage and current vectors as:

$$\vec{\lambda}_{dqs} = \int (\vec{v}_{dqs} - R_s \vec{i}_{dqs}) dt \quad [\text{Eqn. 8}].$$

The flux and current space vectors can be decomposed into vectors at multiples of the fundamental frequency, as:

$$\vec{\lambda}_{dqs} = \Sigma_{n=-\infty}^{+\infty} \vec{\lambda}_{dqs}^{n\omega_e} \text{ and } \vec{i}_{dqs} = \Sigma_{n=-\infty}^{+\infty} \vec{i}_{dqs}^{n\omega_e},$$
$$n=0, 1, 2, \ldots \quad [\text{Eqn. 9}],$$

where the superscript of each decomposed vector indicates its rotating direction and angular speed (frequency) in the vector space. It is noted that, as the DC current and voltage have no effect on the flux, there is no DC component in $\vec{\lambda}_{dqs}$.

The correlation of each component in the injected signals to the torque pulsation can be evaluated separately based on this decomposition analysis. The frequency of the torque variation caused by flux linkage vector $\vec{\lambda}_{dqs}^{\omega_1}$ and current vector $\vec{i}_{dqs}^{\omega_2}$ is $|\omega_1 - \omega_2|$. Therefore, the air-gap torque determined in Eqn. 7 can be extended as:

$$T_{ag} = \frac{p}{2}\left|\left(\sum_{n=-\infty}^{+\infty} \vec{\lambda}_{dqs}^{n \cdot \omega_e}\right) \otimes \left(\sum_{n=-\infty}^{+\infty} \vec{i}_{dqs}^{n \cdot \omega_e}\right)\right| \quad \text{[Eqn. 10]}$$
$$= \frac{p}{2}|\vec{\lambda}_{dqs}^{\omega_e} \otimes \vec{i}_{dqs}^{\omega_e}| + \frac{p}{2}|\vec{\lambda}_{dqs}^{\omega_e} \otimes \vec{i}_{dqs}^{dc}| + \xi_T$$
$$= T_1^{dc} + T_2^{\omega_e} + \xi_T.$$

where $T_1^{dc}$ and $T_2^{\omega_e}$ represent the DC component and the fundamental frequency components at supply frequency $\omega_e$ in the air-gap torque, and $\xi_T$ is the remaining high frequency torque components. Neglecting high-order harmonics in the flux linkage and stator current, the DC component and the $\omega_e$ component in the air-gap torque can be respectively denoted as:

$$|T_{ag}^{dc}| \approx |T_1^{dc}| \approx \frac{p}{2}|\vec{\lambda}_{dqs}^{\omega_e} \otimes \vec{i}_{dqs}^{\omega_e}| \quad \text{[Eqn. 11]}$$
$$|T_{ag}^{\omega_e}| \approx |T_1^{\omega_e}| \approx \frac{p}{2}|\vec{\lambda}_{dqs}^{\omega_e} \otimes \vec{i}_{dqs}^{dc}|.$$

The DC component in the air-gap torque $T_{ag}^{dc}$ is induced by the fundamental frequency component in the phase current $\vec{i}_{dqs}^{\omega_e}$, as in bypass mode, while the fundamental frequency component in the air-gap torque $T_{ag}^{\omega_e}$ is the torque distortion caused by the injected DC current $\vec{i}_{dqs}^{dc}$. It is noted that the negative sequence current caused by the DC injection is negligible compared to the injected DC component, and therefore, the major harmonic in the air-gap torque is the fundamental frequency component $T_{ag}^{\omega_e}$ caused by the injected DC current.

The percentage torque pulsation can thus be simply derived using Eqns. 5 and 11 as:

$$\frac{|T_{ag}^{\omega_e}|}{|T_{ag}^{dc}|} \approx \frac{|\vec{\lambda}_{dqs}^{\omega_e} \otimes \vec{i}_{dqs}^{dc}|}{|\vec{\lambda}_{dqs}^{\omega_e} \otimes \vec{i}_{dqs}^{\omega_e}|} = \frac{|\vec{\lambda}_{dqs}^{\omega_e}| \cdot |\vec{i}_{dqs}^{dc}|}{|\vec{\lambda}_{dqs}^{\omega_e}| \cdot |\vec{i}_{dqs}^{\omega_e}| \cdot \cos(\varphi)} = \frac{\sin(\alpha)}{\cos(\varphi)}, \quad \text{[Eqn. 12]}$$

where $\cos(\phi)$ is the power factor. From this, the percentage torque pulsation caused by the injected DC signal can be controlled within an acceptable range by controlling the delay angle $\alpha$. During operation of soft starter 30 in DC injection mode, the delay angle is adjusted by monitoring the DC and negative sequence components of the stator current, and as a result, the torque pulsations are maintained within a preset tolerance range. While torque pulsation is under the tolerance range, the delay angle can be gradually increased until the optimal delay angle is reached. In one example, the delay angle is controlled to be between 10° and 25° so that the torque pulsation caused by the injected DC signal is within the preset tolerance range.

Since DC injection causes torque pulsation and extra power dissipation in the soft-starter and the motor, it is not necessary to inject the dc signal and estimate $R_s$ and $T_s$ continuously, given a typical motor thermal time constant. The soft-starter 30 can thus be periodically operated in DC injection mode at a pre-defined repetition rate and operated in bypass mode for the remainder of motor operation. Soft-starter 30 is operated in DC injection mode for a minimal time interval that is sufficient to obtain an accurate estimate of $R_s$, while small enough not to cause unacceptable torque pulsation and additional power dissipation.

Given a typical motor thermal time constant, operation of soft-starter 30 in DC injection mode at a periodic rate of once every 5-10 minutes is normally sufficient for thermal protection purposes, depending on the requirements of practical application. However, it is recognized that the soft-starter can be operated in DC injection mode more or less frequently (i.e., greater/lesser periodic rate) based on parameters of the motor and the operation of the motor by a user. As stated above, each operation of soft-starter 30 in DC injection mode lasts for a minimal time interval sufficient to obtain an accurate estimate of $R_s$. Such a time interval can be, for example, for 0.5 seconds and can be repeated every 5-10 min, although longer or shorter DC injection mode intervals are also envisioned. A large enough number of samples of the DC components are measured and determined in the time interval to allow for an accurate estimate of $R_s$. After this time interval of DC injection mode operation, controller 36 in soft-starter 30 (FIGS. 1 and 2) functions to close all contactors 32 to return the soft-starter to normal bypass operation.

It is recognized that, in determining stator resistance from the injected DC components, other factors/variables may be considered. For example, since $v_{ab}^{dc}$ and $i_a^{dc}$ are obtained from the mean of $v_{ab}$ and $i_a$ during DC injection mode, the DC offsets in the voltage and current measurements influence the accuracy of the $R_s$ estimate. Therefore, the DC offsets of the measurements can be compensated. According to one embodiment of the invention, and assuming that the DC component in the supply voltage can be neglected, the offsets can be calculated by the mean of $v_{ab}$ and $i_a$ for an integer number of cycles in the bypass mode before each DC injection mode period, when there is no injected DC signal. For example, the mean of the $v_{ab}$ and $i_a$ measurements for 15 cycles in the bypass mode before each DC injection mode can be calculated as measurement offsets. After compensation for the measurement offsets, the equation for $R_s$ calculation is modified from Eqn. 1 to:

$$R_s = k \cdot \frac{(v_{ab}^{dc} - v_{offset})}{(i_a^{dc} - i_{offset})}. \quad \text{[Eqn. 13]}$$

Similar to Eqn. 1, for a three-phase AC motor having windings in a wye-arrangement, the constant k=213.

In another embodiment of the invention, if soft-starter 30 is installed in a motor control center (not shown) and the motor terminals 24, 26 and 28 (FIG. 1) are not accessible, the resistance of a cable connecting the AC motor 10 to soft-starter 30 is considered. That is, as the resistance of the cable may not be negligible compared to $R_s$, the $R_s$ estimate set forth in Eqn. 1 becomes:

$$R_s = k \cdot \frac{v_{ab}^{dc}}{i_a^{dc}} - R_{cable} \text{ or}$$ [Eqn. 14]

$$R_s = k \cdot \frac{v_{th}^{dc}}{i_a^{dc}} - R_{cable} - R_{source},$$

where again, for example, k=2/3 for a three-phase AC motor having windings in a wye-arrangement.

To obtain accurate $R_s$ estimates, the cable resistance must be compensated by measurement or estimation of $R_{cable}$. When measuring $R_{cable}$ is not possible, given the cable number in the American Wire Gauge (AWG) standard, $R_{cable}$ can be estimated based on the resistivity ρ given by the AWG standard, the approximate length l of the cable and the ambient temperature $T_A$ as:

$$R_{cable} = \rho l + \mu \rho l (T_{A-T0})$$ [Eqn. 15], where μ is the temperature coefficient of resistivity and $T_0$ is the room temperature, assuming that the cable temperature is the same as ambient temperature.

It is noted that the system and method set forth above for injecting a DC component into an AC motor power supply enables online $R_s$ estimation using only the motor terminal voltages and currents, without the need of any other sensors, such as speed and torque transducers. Such an arrangement allows for a nonintrusive, sensorless, and low-cost technique for determining stator winding resistance in real-time while the AC motor is in operation.

A technical contribution for the disclosed method and apparatus is that it provides for a computer implemented technique for determining stator winding resistance for thermal protection of AC motors. The technique controls switching time of a switch in a motor control device to generate a DC component in an output of the motor control device corresponding to an input to the AC motor and determines a stator winding resistance from the DC component. A temperature of the stator windings can also be determined in the technique based on the stator winding resistance.

Therefore, according to one embodiment of the present invention, a motor control device to determine resistance of a stator winding of an AC motor includes a circuit having an input connectable to an AC source and an output connectable to an input terminal of an AC motor. The circuit further includes at least one contactor and at least one switch to control current flow and terminal voltages in the AC motor. The motor control device also includes a controller connected to the circuit and configured to modify switching time of the at least one switch to create a DC component in an output of the motor control device corresponding to an input to the AC motor and determine a stator winding resistance of the AC motor based on the injected DC component of the voltage and current.

According to another embodiment of present invention, a method for determining resistance of a stator winding of an AC motor without added sensors includes the step of providing a soft-starter in series between an AC power source and the AC motor, the soft-starter comprising at least one contactor and at least one solid-state switch to condition voltage and current to the AC motor. The method also includes the step of selectively operating the soft-starter in a bypass mode and a DC injection mode, wherein the bypass mode bypasses the DC injection mode for normal operation and wherein operating the soft-starter in the DC injection mode comprises opening a contactor for one phase and transmitting a gate drive signal having a delay angle therein to the at least one solid-state switch for the one phase, thereby introducing a DC bias into a phase of the AC motor Operating the soft-starter in the DC injection mode also includes measuring the DC bias in the voltage and current provided to the AC motor and determining the resistance of the stator winding based on the measured DC bias.

According to yet another embodiment of the present invention, a soft-starter to control transmission of voltage and current from an AC power source to an induction motor having a stator winding includes a plurality of supply lines, with each supply line corresponding to a phase in the induction motor. The soft-starter also includes at least one solid-state switch on at least one of the plurality of supply lines to condition a motor line voltage and phase current to the induction motor and a processor programmed to delay gating of the at least one solid-state switch on one supply line to cause a DC component therein and determine the resistance of the stator winding based on the DC component.

The present invention has been described in terms of the preferred embodiment, and it is recognized that equivalents, alternatives, and modifications, aside from those expressly stated, are possible and within the scope of the appending claims.

What is claimed is:

1. A motor control device to determine resistance of a stator winding of an AC motor, the motor control device comprising:
   a circuit having an input connectable to an AC source and an output connectable to an input terminal of an AC motor, the circuit including at least one contactor and at least one switch to control current flow and terminal voltages in the AC motor; and
   a controller connected to the circuit and configured to:
      modify switching time of the at least one switch to create a DC component in an output of the motor control device corresponding to an input to the AC motor; and
      determine a stator winding resistance of the AC motor based on the DC component of the voltage and current;
   wherein the controller is further configured to control a delay in the switching time of the at least one switch when creating the DC component so as to control a torque pulsation in the AC motor.

2. The motor control device of claim 1 further comprising a plurality of contactors and a plurality of switches, wherein a contactor and a pair of switches correspond to each phase in a multi-phase AC motor, and wherein the controller modifies the switching time to cause a disturbance in at least one of the phases to the multi-phase AC motor.

3. The motor control device of claim 2 wherein the controller is further configured to:
   selectively open and close one contactor corresponding to a single phase of the AC motor; and
   selectively transmit a gate drive signal to the pair of switches corresponding to the single phase, wherein the gate drive signal transmitted to one of the pair of switches is delayed compared to the gate drive signal to the other switch to inject a DC component into each phase of the AC motor.

4. The motor control device of claim 2 wherein the plurality of switches are solid-state switches and comprise a plurality of thyristors, and wherein the pair of switches corresponding to each phase in the AC motor comprise a pair of thyristors in an anti-parallel arrangement.

5. The motor control device of claim 1 wherein the controller is further configured to determine a temperature of the stator winding based on the determined stator resistance in real-time while the AC motor is in operation, and wherein the motor control device is at least one of a soft-starter and a motor drive; and wherein the controller is further configured to generate an alert if the stator winding temperature exceeds a pre-determined threshold.

6. The motor control device of claim 1 further comprising voltage and current sensors therein, and wherein the controller determines an amplitude of the DC component from a line-to-line voltage and a phase current resulting from a disturbance therein caused by the modified switching time.

7. The motor control device of claim 1 wherein the controller is configured to periodically modify switching time at pre-defined times during motor operation.

8. The motor control device of claim 7 wherein the controller is further configured to measure the DC component injected at each of the plurality of pre-defined times.

9. The motor control device of claim 1 wherein the controller is further configured to:
   determine a voltage offset and a current offset; and
   subtract the DC component in the voltage and current from the voltage and current offset to determine the resistance of the stator winding.

10. The motor control device of claim 1 wherein the controller is further configured to compensate for a cable resistance in the DC component to determine the resistance of the stator winding.

11. The motor control device of claim 1 wherein the controller is further configured to control the delay in the switching time of the at least one switch to maintain the torque pulsation in the AC motor within a preset tolerance range.

12. The motor control device of claim 1 wherein the controller is further configured to analyze dominant components in the torque pulsation, and correlations thereof to the created DC component, using sequence analysis theory.

13. A method for determining resistance of a stator winding of an AC motor without added sensors comprising:
   providing a soft-starter in series between an AC power source and the AC motor, the soft-starter comprising at least one contactor and at least one solid-state switch to condition voltage and current to the AC motor;
   selectively operating the soft-starter in a bypass mode and a DC injection mode, wherein operating the soft-starter in the DC injection mode comprises:
      opening a contactor for one phase;
      transmitting a gate drive signal having a delay angle therein to the at least one solid-state switch for the one phase, thereby introducing a DC bias into a phase of the AC motor;
      measuring the DC bias in the voltage and current provided to the AC motor;
      determining the resistance of the stator winding based on the measured DC bias; and wherein the bypass mode bypasses the DC injection mode for normal operation.

14. The method of claim 13 further comprising determining a temperature of the stator winding based on the determined resistance of the stator winding according to:

$$\hat{T}_s = T_{s0} + \frac{(\hat{R}_s - R_{s0})}{\mu \cdot R_{s0}},$$

where $T_{s0}$ and $R_{s0}$ represent the stator winding temperature and stator winding resistance at room temperature, $\hat{R}_s$ is the determined stator winding resistance from DC injection; and $\mu$ is the temperature coefficient of resistivity.

15. The method of claim 14 further comprising generating an alert if the temperature of the stator winding exceeds a pre-determined threshold.

16. The method of claim 13 further comprising adjusting a value of the delay angle to vary a level of the DC bias introduced into each phase.

17. The method of claim 13 further comprising operating the soft-starter in the DC injection mode at a pre-determined periodic rate.

18. The method of claim 13 wherein measuring the DC bias comprises measuring at least one line-to-line voltage and at least one current in a multi-phase soft-starter.

19. A soft-starter to control transmission of voltage and current from an AC power source to an induction motor having a stator winding, the soft-starter comprising:
   a plurality of supply lines, each supply line corresponding to a phase in the induction motor;
   at least one solid-state switch on at least one of the plurality of supply lines to condition a motor line voltage and phase current to the induction motor; and
   a processor programmed to:
      delay gating of the at least one solid-state switch on one supply line to cause a DC component therein;
      determine the resistance of the stator winding based on the DC component;
      monitor an amount of torque pulsation in the induction motor; and
      adjust the delay in gating to maintain the torque pulsation within a desired tolerance range.

20. The soft-starter of claim 19 wherein the processor is further programmed to:
   determine a temperature of the stator winding based on the determined resistance of the stator winding; and
   generate an alert if the temperature of the stator winding exceeds a pre-determined threshold.

* * * * *